United States Patent
Lee et al.

(10) Patent No.: US 11,678,507 B2
(45) Date of Patent: Jun. 13, 2023

(54) DISPLAY APPARATUS HAVING A CRACK RESISTANT STRUCTURE

(71) Applicant: LG Display Co., Ltd., Seoul (KR)

(72) Inventors: Saemleenuri Lee, Paju-si (KR); Dohyung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 239 days.

(21) Appl. No.: 17/135,172

(22) Filed: Dec. 28, 2020

(65) Prior Publication Data

US 2021/0202905 A1  Jul. 1, 2021

(30) Foreign Application Priority Data

Dec. 31, 2019  (KR) .................. 10-2019-0180093

(51) Int. Cl.
*H10K 50/844* (2023.01)
*H10K 59/131* (2023.01)

(52) U.S. Cl.
CPC ......... *H10K 50/844* (2023.02); *H10K 59/131* (2023.02)

(58) Field of Classification Search
CPC ............ H01L 51/5253; H01L 27/3276; H10K 50/844; H10K 59/131
USPC .................................................... 257/40, 59
See application file for complete search history.

(56) References Cited

U.S. PATENT DOCUMENTS

| | | | |
|---|---|---|---|
| 9,780,157 B2 | 10/2017 | Kwon et al. | |
| 2006/0060850 A1* | 3/2006 | Kwak | H01L 27/3276 257/E27.111 |
| 2008/0197778 A1* | 8/2008 | Kubota | H01L 51/5228 315/73 |
| 2012/0097927 A1* | 4/2012 | Shin | H01L 27/3246 257/40 |
| 2015/0228927 A1 | 8/2015 | Kim | |
| 2017/0069873 A1* | 3/2017 | Kim | H01L 51/525 |
| 2018/0102502 A1 | 4/2018 | Kim et al. | |
| 2018/0287093 A1 | 10/2018 | Lee et al. | |
| 2019/0131375 A1* | 5/2019 | Kim | H01L 27/3276 |
| 2019/0305003 A1* | 10/2019 | Tan | H01L 27/127 |
| 2020/0035946 A1* | 1/2020 | Cheng | H01L 51/5253 |

FOREIGN PATENT DOCUMENTS

| | | |
|---|---|---|
| JP | 2019-16474 A | 1/2019 |
| JP | 2019-53292 A | 4/2019 |
| KR | 10-2017-0095809 A | 8/2017 |

* cited by examiner

*Primary Examiner* — Lex H Malsawma
*Assistant Examiner* — Eric W Jones
(74) *Attorney, Agent, or Firm* — Birch, Stewart, Kolasch & Birch, LLP

(57) ABSTRACT

A display apparatus is discussed, which comprises a substrate including a display area and a non-display area, an inorganic layer provided on the substrate, an organic layer provided on the inorganic layer, a light emitting diode provided in the display area of the substrate and including a first electrode, a light emitting layer and a second electrode, and a ground line provided on the organic layer and provided in at least a portion of the non-display area, wherein the ground line and the second electrode are electrically connected with each other, and the ground line includes at least one concave portion and at least one convex portion, which are arranged to adjoin each other.

19 Claims, 9 Drawing Sheets

DISPLAY APPARATUS HAVING A CRACK RESISTANT STRUCTURE

CROSS-REFERENCE TO RELATED APPLICATIONS

This application claims the priority benefit of the Korean Patent Application No. 10-2019-0180093 filed on Dec. 31, 2019 in the Republic of Korea, the entire contents of which are hereby expressly incorporated by reference as if fully set forth herein into the present application.

BACKGROUND ART

Technical Field

The present disclosure relates to a display apparatus.

Description of the Related Art

Generally, a display apparatus is widely used as a display screen of various electronic devices such as a mobile communication terminal, an electronic diary, an electronic book, a portable multimedia player (PMP), a navigator, an Ultra Mobile PC (UMPC), a mobile phone, a smart phone, a tablet personal computer (PC), a watch phone, an electronic pad, a wearable device, a watch phone, a portable information device, a vehicle control display device, a television, a notebook computer, a monitor, etc.

A ground line for supplying a ground power source to a display apparatus can be formed in a non-display area of the display apparatus. If the ground line is formed of a material having a high residual stress or formed at a thick thickness, a crack can occur in the ground line, whereby a problem can occur in making sure of the reliability of the display apparatus.

BRIEF SUMMARY OF THE INVENTION

An object of the present disclosure is to provide a display apparatus having high resistance to a damage of a ground line.

Another object of the present disclosure is to provide a display apparatus comprising a ground line having low resistance.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display apparatus comprising a substrate including a display area and a non-display area, an inorganic layer provided on the substrate, an organic layer provided on the inorganic layer, a light emitting diode provided in the display area of the substrate, including a first electrode, a light emitting layer and a second electrode, and a ground line provided on the organic layer and provided in at least a portion of the non-display area, wherein the ground line and the second electrode are electrically connected with each other, and the ground line includes at least one concave portion and at least one convex portion, which are arranged to adjoin each other.

According to the present disclosure, as the ground line includes a concave portion and a convex portion, which have a step height, a display apparatus can be provided in which a resistance to a damage from a stress remaining in the middle of a manufacturing process of the display apparatus or a stress caused by an external factor is improved.

According to the present disclosure, as the ground line has an increased surface area, low resistance is provided, whereby a display apparatus can be provided in which luminance uniformity is improved.

In addition to the effects and advantages of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
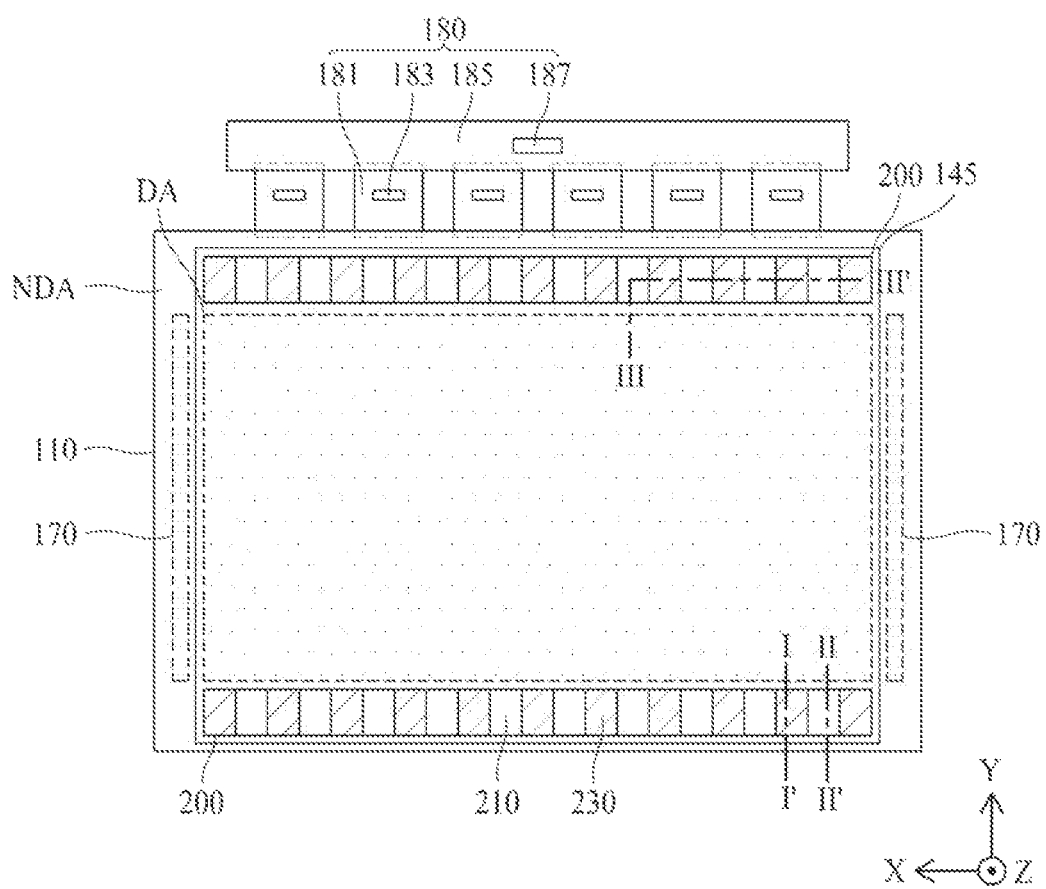
FIG. 1 is a plane view illustrating a display apparatus according to one embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a time relationship, for example, when the temporal order is described as 'after-', 'subsequent-', 'next-' and 'before-' a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, a display apparatus according to various embodiments of the present disclosure will be described in detail with reference to the accompanying drawings. All the components of the display apparatus according to all embodiments of the present disclosure are operatively coupled and configured.

Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
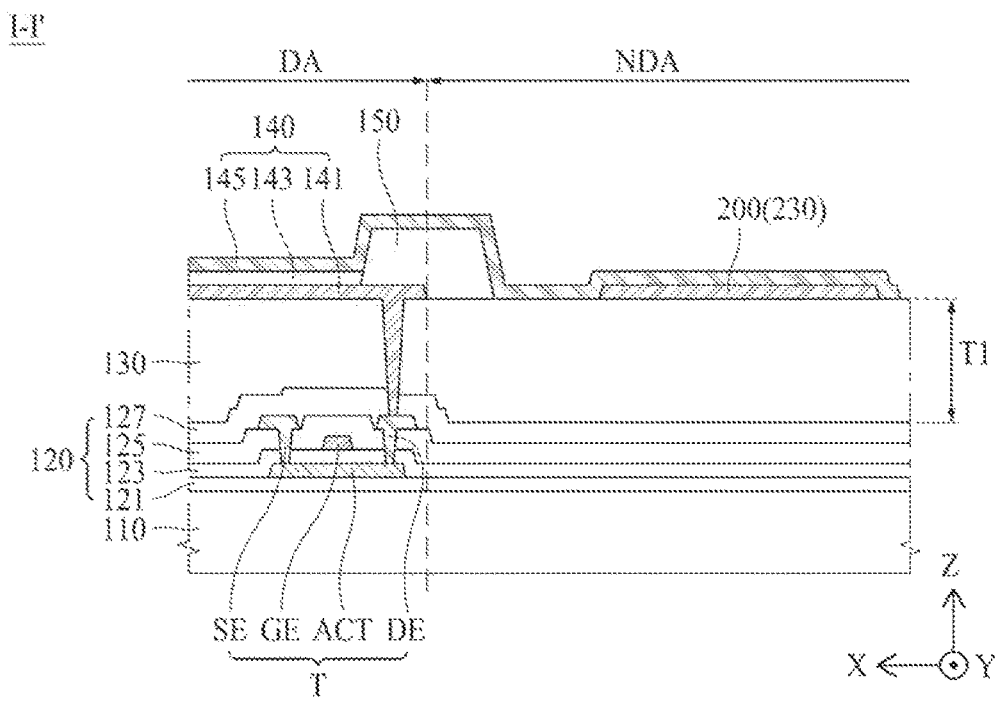
FIG. 2 is a cross-sectional view taken along line I-I' shown in FIG. 1.
Figure 3:
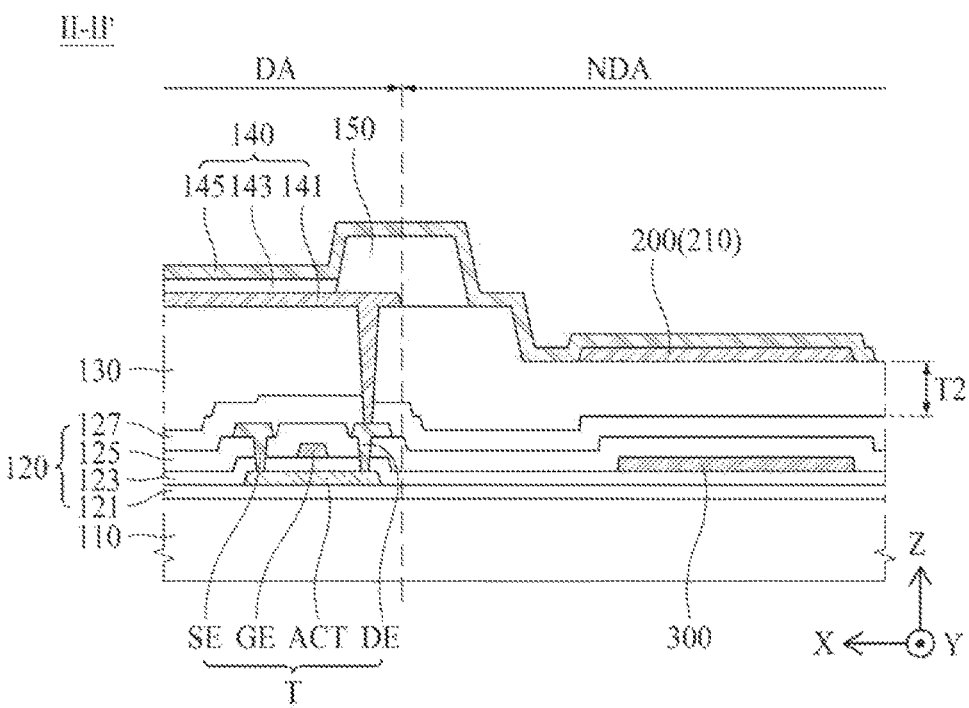
FIG. 3 is a cross-sectional view taken along line II-IF shown in FIG. 1.

FIG. 1 is a plane view illustrating a display apparatus according to one embodiment of the present disclosure, FIG. 2 is a cross-sectional view taken along line I-I' shown in FIG. 1, and FIG. 3 is a cross-sectional view taken along line II-IF shown in FIG. 1.

Referring to FIGS. 1 to 3, the display apparatus according to one embodiment of the present disclosure comprises a substrate 100 that includes a display area DA and a non-display area NDA, an inorganic layer 120 formed on the substrate 110, an organic layer 130 formed on the inorganic layer 120, a light emitting diode 140 formed in the display area DA of the substrate 110, including a first electrode 141, a light emitting layer 143 and a second electrode 145, and a ground line 200 formed on the organic layer 130 and formed in at least a portion of the non-display area NDA, wherein the ground line 200 and the second electrode 145 are electrically connected with each other, and the ground line 200 includes at least one concave portion 210 and at least one convex portion 230, which are arranged to be adjacent to each other.

The substrate 110 is a base substrate, and can be a flexible substrate or a glass substrate. According to one example, the substrate 110 can include a transparent polyimide material but can be made of a transparent plastic material such as polyethylene terephthalate (PET) without limitation to the transparent polyimide. According to one example, the substrate 110 can be a glass substrate that includes silicon dioxide $SiO_2$ or aluminium oxide $Al_2O_3$ as a main component.

The substrate 110 can be defined by the display area DA displaying a screen and the non-display area NDA surrounding the display area. Also, a pad area can be formed at one side of the non-display area NDA, and a display driving circuit 180, which will be described later, can be arranged in the pad area.

Although the inorganic layer 120 can include a buffer layer 121, a gate insulating layer 123, an inter-layer dielectric layer 125, and a passivation layer 127, which are formed on the substrate 110, the elements of the inorganic layer are not limited to the buffer layer 121, the gate insulating layer 123, the inter-layer dielectric layer 125 and the passivation layer 127, which are shown in FIG. 2.

The buffer layer 121 can be made of a single layer of silicon nitride SiNx or silicon oxide SiOx which is an inorganic material or a multi-layered layer of silicon nitride SiNx and silicon oxide SiOx. The buffer layer 121 can improve adhesion between the layers formed on the buffer layer 121 and the substrate 110.

The gate insulating layer 123 is arranged on the buffer layer 121 and an active layer ACT which will be described later. The gate insulating layer 123 can be made of a single layer of silicon nitride SiNx or silicon oxide SiOx which is an inorganic material or a multi-layered layer of silicon nitride SiNx and silicon oxide SiOx. The gate insulating layer 123 includes a contact hole for contacting each of a source electrode SE and a drain electrode DE to each of source and drain areas of the active layer ACT.

The inter-layer dielectric layer 125 can be provided to cover a gate electrode GE, and can serve to protect a thin film transistor T. A corresponding area of the inter-layer dielectric layer 125 can be removed to contact the active layer ACT with the source electrode SE or the drain electrode DE. For example, the inter-layer dielectric layer 125 can include a contact hole through which the source electrode SE passes, and a contact hole through which the drain electrode DE passes. According to one example, the inter-layer dielectric layer 125 can include a silicon dioxide $SiO_2$ film or silicon nitride SiN film, or can include multiple layers that include silicon dioxide $SiO_2$ film and silicon nitride SiN film.

The passivation layer 127 can be arranged to cover the thin film transistor T which will be described later. The passivation layer 127 is an insulating layer for protecting the thin film transistor T. The passivation layer 127 can be made of a single layer of silicon nitride SiNx or silicon oxide SiOx which is an inorganic material or a multi-layered layer of silicon nitride SiNx and silicon oxide SiOx. The passivation layer 127 can include a contact hole for connecting the first electrode 141 of the light emitting diode 140 with the thin film transistor T.

According to one embodiment of the present disclosure, considering a process aspect for forming a trench portion which will be described later, the inorganic layer 120 that includes the buffer layer 121, the gate insulating layer 123, the inter-layer dielectric layer 125 and the passivation layer 127 can be made of one selected from silicon dioxide $SiO_2$ and silicon nitride SiNx. However, the embodiment of the present disclosure is not limited to this example, and one selected from silicon dioxide $SiO_2$ and silicon nitride SiNx can be used as each of the buffer layer, the gate insulating layer, the inter-layer dielectric layer and the passivation layer, or a deposited structure of silicon dioxide $SiO_2$ and silicon nitride SiNx can be applied to each of the buffer layer, the gate insulating layer, the inter-layer dielectric layer and the passivation layer.

The material constituting each of the buffer layer 121, the gate insulating layer 123, the inter-layer insulating layer 125 and the passivation layer 127 is not limited to silicon dioxide Sift or silicon nitride SiNx, and a material used as the buffer layer 121, the gate insulating layer 123, the inter-layer insulating layer 125 and the passivation layer 127 in the art can be used without limitation.

The organic layer 130 can be arranged on the inorganic layer 120. The organic layer 130 is an insulating layer for planarizing the thin film transistor T, and can be made of an organism. Since the passivation layer 127 is formed along a shape of an upper portion of the thin film transistor T, the passivation layer 127 is not planarized by the thin film transistor T and a storage capacitor, whereby a step height can exist. Therefore, as the organic layer 130 planarizes the upper portion of the thin film transistor T, the light emitting diode 140 can be formed in a substantially flat area. A contact hole for exposing the drain electrode DE of the thin film transistor T can be formed in the organic layer 130. According to one example, the organic layer 130 can be made of an organic insulating material such as photo acryl or BCB, which has a planarization characteristic during deposition.

The organic layer 130 according to one embodiment of the present disclosure can be provided in an area overlapped with an concave portion 210 of the ground line 200, which will be described later, at a relatively thin thickness as compared with the organic layer 130 of the display area DA, and can be provided in an area overlapped with the convex portion 230 of the ground line 200 at a substantially same thickness as compared with the organic layer 130 of the display area DA.

Further, the display apparatus according to one embodiment of the present disclosure can comprise at least one thin film transistor T. For example, the thin film transistor T can be a driving thin film transistor or a scan thin film transistor.

According to one example, the thin film transistor can include an active layer ACT, a gate electrode GE formed on the active layer ACT, a gate insulating film 123 arranged between the active layer ACT and the gate electrode GE, a source electrode SE connected to one side of the active layer ACT, and a drain electrode DE connected to the other side of the active layer ACT, and can further include an inter-layer dielectric film 125 protecting the thin film transistor while electrically spacing the gate electrode GE, the source electrode SE and the drain electrode DE apart from one another, and a passivation layer 127 covering the thin film transistor T. In this case, since the gate insulating film 123, the inter-layer dielectric film 125 and the passivation layer 127 are the same as those of the aforementioned description, their repeated description will be omitted.

The active layer ACT can be provided in a pixel area of the substrate 110. The active layer ACT can be arranged to overlap the gate electrode GE, the source electrode SE and the drain electrode DE, and the active layer ACT can include a channel area and source/drain areas, wherein the channel area can be formed in a central area of the active layer ACT, and the source/drain areas can be formed in parallel with each other by interposing the channel area therebetween.

The gate electrode GE can apply a gate voltage to the active layer ACT of the thin film transistor T. According to one example, the gate electrode GE can be formed by being deposited as a single layer or a double layer. For example, although the gate electrode GE can include a metal material such as Mo, a material known in the art can be used without limitation.

The source electrode SE and the drain electrode DE can form an ohmic contact with each of the source area and the drain area of the active layer ACT, and can be formed of a metal material having low resistance.

Although FIG. 2 shows the thin film transistor T of a top gate structure in which the gate electrode GE is arranged on the active layer ACT, the thin film transistor T of the present disclosure is not limited to the top gate structure, and various structures of the thin film transistor T used in the art can be applied to the present disclosure.

The light emitting diode 140 can include a first electrode 141, a light emitting layer 143 and a second electrode 145. For example, the light emitting diode 140 can be formed in the display area, and can include a first electrode 141, a light emitting layer 143 and a second electrode 145, which are electrically connected with the thin film transistor T for driving the light emitting diode.

The first electrode 141 is an anode electrode, and can be provided on the organic layer 130 in a pattern shape. The first electrode 141 can electrically be connected with the drain electrode DE of the thin film transistor through a contact hole provided in the organic layer 130 to receive a data signal output from the thin film transistor. The first electrode 141 can include a metal material or a transparent conductive oxide, for example, a material such as copper Cu, molybdenum-titanium MoTi and indium tin oxide ITO. Also, the first electrode 141 can be provided as, but not limited to, a single layer or multiple layers.

The light emitting layer 143 is a light emitting layer EL for emitting light of a specific color, and can include one of a red light emitting layer, a green light emitting layer, a blue light emitting layer and a white light emitting layer. If the light emitting layer EL includes a white light emitting layer, a color filter for converting white light from the white light emitting layer to another colored light can be arranged on the light emitting diode E. Also, the light emitting layer EL can further include a hole transporting layer, a hole injecting layer, an electron injecting layer, and an electron transporting layer in addition to the light emitting layer.

The second electrode 145 can be made of a conductive material having a low work function. The second electrode 145 can be formed of aluminium Al, magnesium Mg, silver Ag, or their alloy, for example.

In FIGS. 1 to 3, although the light emitting diode 140 that includes the first electrode 141, the light emitting layer 143 and the second electrode 145 is described based on a top emission type display apparatus in which light is emitted to the outside through the second electrode 145, the embodiment of the present disclosure is not limited to the top emission type.

The second electrode 145 can commonly be formed in a plurality of pixels to overlap the display area DA. Also, the second electrode 145 can be arranged to overlap the display area DA and formed to overlap at least a portion of the non-display area NDA. In detail, the second electrode 145, as shown in FIG. 1, can be formed to overlap the ground line 200 of the non-display area NDA while overlapping the display area DA. Therefore, the second electrode 145 can be formed in the non-display area NDA in a physical contact structure with the ground line 200.

Also, the display apparatus according to one embodiment of the present disclosure can further comprise a bank 150. The bank 150 can be arranged on the organic layer 130 while overlapping at least a portion of the first electrode 141. The bank 150 can be arranged to surround the light emitting layer 143 of the display area DA, and can be arranged in a boundary of the display area DA and the non-display area NDA. According to one example, the bank 150 can be made of an organism. For example, the bank 150 can be made of, but not limited to, polyimide based resin, acryl based resin or BCB based resin.

The scan driving integrated circuit 170 is provided in the non-display area NDA of the substrate 110. The scan driving integrated circuit 170 can provide a scan control signal provided from the display driving circuit 180 to the pixel provided in the display area.

The display driving circuit 180 can be connected to the pad portion provided in the non-display area NDA of the substrate 110 to display an image corresponding to image data supplied from the display driving system in each pixel. The display driving circuit 180 according to one example can include a flexible circuit film 181, a data driving integrated circuit 183, a printed circuit board 185, and a timing controller 187.

The ground line 200 can be arranged to overlap at least a portion of the non-display area NDA adjacent to the display area DA, and can be arranged on the organic layer 130.

Although FIG. 1 shows that the ground line 200 is formed in the non-display area NDA arranged at one side and the other side in Y direction based on the display area DA, the embodiment of the present disclosure is not limited to this example. For example, the ground line 200 can be formed at only one side of the non-display area surrounding the display area DA in accordance with a design condition of the display apparatus, or can additionally be arranged at one side and the other side in X direction in the display apparatus shown in FIG. 1 to fully surround the outside of the display area DA. The ground line 200 can be a line for supplying a ground power source.

Also, the second electrode 145 of the light emitting diode 140 can be arranged to be in contact with at least a portion of the ground line 200 in the non-display area NDA.

The second electrode 145 can be supplied with a ground voltage or ground voltage in contact with the ground line 200, and can electrically be in contact with the ground line 200 to lower a resistance applied to the second electrode 145.

The ground line 200 can be formed of the same material as that of the first electrode 141 of the light emitting diode 140 by the same process as that of the first electrode 141. According to one example, the ground line 200 and the first electrode 141 of the light emitting diode 140 can be formed of the same material as each other on the organic layer 130 by the same process. Subsequently, the first electrode 141 and the ground line 200 can be identified from each other by a preset pattern through a photolithography process.

For example, the ground line 200 can include a material such as copper Cu, molybdenum-titanium MoTi and indium tin oxide ITO. Also, the ground line 200 can be provided as, but not limited to, a single layer or multiple layers. If the ground line 200 includes a metal material containing Mo and is formed of a material having a high stress generated during a manufacturing process or needs to be formed at a thick thickness, a crack can occur due to a stress generated during the manufacturing process of the ground line 200 or a stress or external impact generated during driving of the display apparatus.

According to one embodiment of the present disclosure, the display apparatus can further comprise a link line 300 arranged in the non-display area NDA. The link line 300 can be at least one of a gate link line and a data link line for driving the pixel of the display apparatus. However, the link line 300 can be one of various link lines required for driving of the display apparatus without limitation to the gate link line or the data link line.

According to one example, the link line 300 can be prepared with, but not limited to, the same material as that of the gate electrode GE of the thin film transistor T by the same process as that of the gate electrode GE of the thin film transistor T.

As shown in FIG. 3, the link line 300 can be arranged in at least a portion of the non-display area NDA. Also, the link line 300 can be arranged to overlap the concave portion 210 of the ground line 200 in parallel with the concave portion 210 of the ground line 200.

As shown in FIG. 1, the ground line 200 according to one embodiment of the present disclosure can include at least one concave portion 210 and at least one convex portion 230, which are arranged to adjoin each other. Also, each of the concave portion 210 and the convex portion 230 can be formed in a line pattern aligned in one direction. In this case, one direction can preferably be Y direction, and the embodiment of the present disclosure is not limited to Y direction.

Also, the concave portion 210 and the convex portion 230 of the ground line 200 according to the present disclosure can be formed to have a predetermined step height. If a residual stress, which can occur during the manufacturing process of the display apparatus, or a stress, which can occur outside the display apparatus, is applied to the ground line 200 by the step height, a structure that the stress is dispersed can be provided, whereby reliability of the display apparatus can be improved.

As shown in FIGS. 2 and 3, if the second electrode 145 is in contact with a position corresponding to the convex portion 230 of the ground line 200, at least a portion of the organic layer 130 of the non-display area NDA can be set to have a thickness of T1. In this case, the thickness T1 of the organic layer 130 of the non-display area NDA can substantially be the same as a thickness of the organic layer 130 of the display area DA. If the second electrode 145 is in contact with a position corresponding to the concave portion 210 of the ground line 200, at least a portion of the organic layer 130 of the non-display area NDA can be set to have a thickness of T2. In this case, the thickness T2 of the organic layer 130 of the non-display area NDA can approximately correspond to a half of the thickness of T1.

According to one example, as the ground line 200 has a step height structure formed by the concave portion 210 and the convex portion 230, its surface area can be increased. A structure of the ground line 200 of which surface area is increased as compared with the structure of the ground line 200 having no step height structure of the concave portion 210 and the convex portion 230 can be provided. Therefore, the display apparatus that comprises the ground line 200 according to the present disclosure can lower a resistance value of the second electrode 145, increase luminance uniformity in the pixel, and improve driving reliability of the display apparatus. The step height of the concave portion 210 and the convex portion 230 of the ground line 200 and its detailed structure will be described later with reference to FIGS. 4 and 5.

Figure 4:
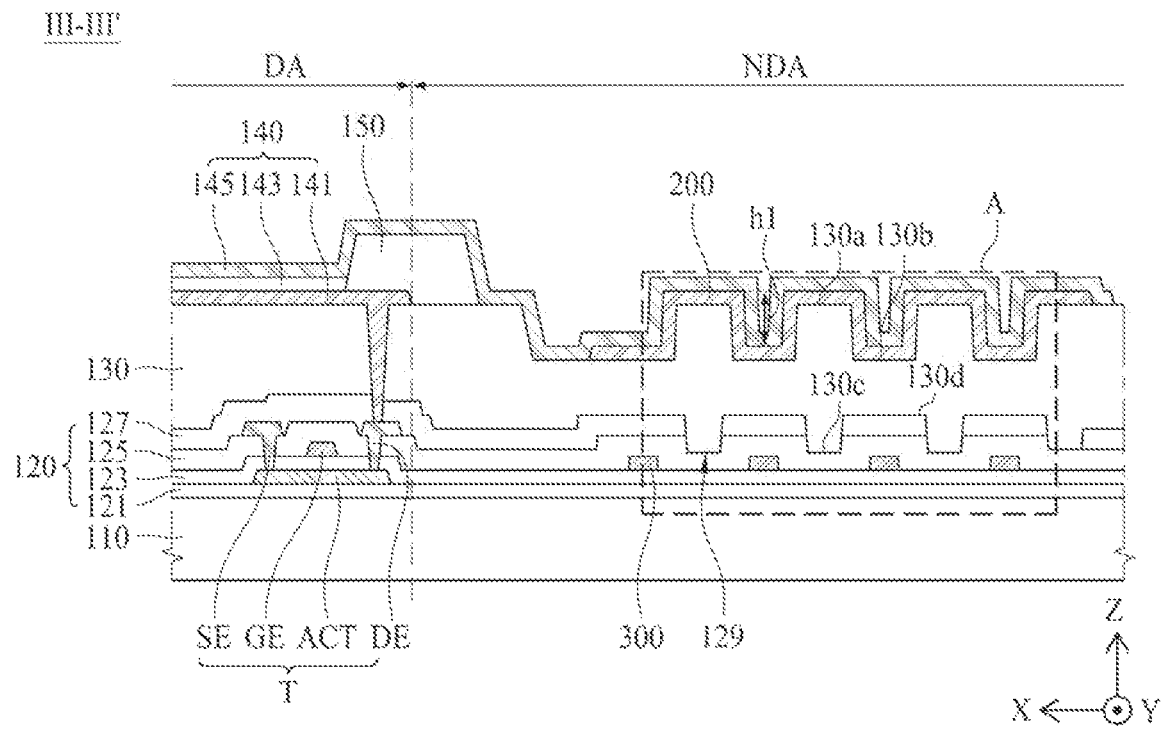
FIG. 4 is a cross-sectional view taken along line shown in FIG. 1.
Figure 5:
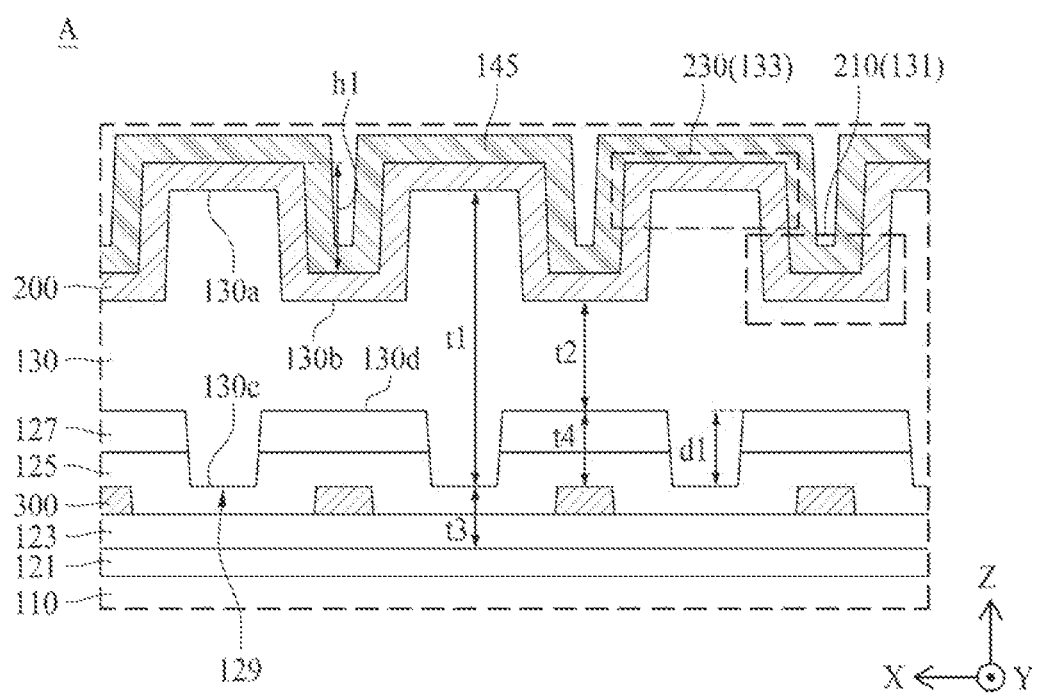
FIG. 5 is an enlarged view illustrating a portion A of FIG. 4.

FIG. 4 is a cross-sectional view taken along line shown in FIG. 1, and FIG. 5 is an enlarged view illustrating a portion A of FIG. 4. Since the display apparatus in FIGS. 4 and 5 is the same as the display apparatus described in FIGS. 1 to 3 except the structure of the non-display area NDA, its repeated description will be omitted.

Referring to FIGS. 4 and 5, as the ground line 200 has a predetermined step height h1 formed by the concave portion 210 and the convex portion 230, its surface area can be increased, and a structure of the ground line 200 of which surface area is increased as compared with the structure of the ground line 200 having no step height of the concave portion 210 and the convex portion 230 can be provided. Therefore, the display apparatus that comprises the ground line 200 according to the present disclosure can lower a resistance value of the second electrode 145 of the light emitting diode 140 and improve driving reliability of the display apparatus.

In this case, the concave portion 210 and the convex portion 230 of the ground line 200 can be defined as follows based on the step height h1 of the concave portion 210 and the convex portion 230. The concave portion 210 can be defined as an area formed at a half height or less of the step height h1, and the convex portion 230 can be defined as an area formed at a half height or more of the step height h1.

The inorganic layer 120 can include at least one trench portion 129, and the trench portion 129 can be arranged to overlap the convex portion 230 of the ground line 200 and non-overlap the concave portion 210 of the ground line 200. In the display apparatus according to the present disclosure, a stress propagated through the inorganic layer 120 can be reduced through at least one trench portion 129 formed in the inorganic layer 120, and reliability of the display apparatus can be improved. Also, the trench portion 129 can be arranged to be parallel with the link line 300, and the trench portion 129 can be formed in the area non-overlapped with the link line 300.

The trench portion 129 can be formed to have a predetermined depth d1 ranging from 200 nm to 800 nm. According to one example, the trench portion 129 can be set to have a depth of 200 nm to 800 nm, preferably can be set to have a depth of 600 nm, approximately. If the depth d1 of the trench portion 129 is less than 200 nm, a dispersed effect of the stress propagated through the inorganic layer 120 can be lowered, and if the depth d1 of the trench portion 129 exceeds 800 nm, arrangement density of the trench portion 129 formed in the inorganic layer 120 is restricted, whereby a dispersed effect of the stress can be lowered. However, the depth of the trench portion 129 according to the present disclosure is not limited to the above numerical range, and can be changed depending on a design of the display apparatus.

Also, although FIGS. 4 and 5 show that the trench portion 129 is formed through removal of the inter-layer dielectric layer 125 and the passivation layer 127, the embodiment of the present disclosure is not limited to this example. Therefore, the depth of the trench portion 129 in the embodiment of the present disclosure can be prepared as the buffer layer 121, the gate insulating layer 123, the inter-layer insulating layer 125 and the passivation layer 129 are selectively removed in accordance with a proper depth required in the display apparatus.

The organic layer 130 can be arranged to fill the trench portion 129 of the aforementioned inorganic layer 120. Also, the organic layer 130 according to the present disclosure can be prepared such that an upper surface of the organic layer 130 includes an organic layer concave portion 131 and an organic layer convex portion 133, thereby forming the structure corresponding to the concave portion 210 and the convex portion 230. According to one example, the organic layer concave portion 131 and the organic layer convex portion 133 can be prepared as the portion corresponding to the concave portion 131 of the organic layer 130 of the non-display area NDA is removed.

According to one example, the ground line 200 can have a shape corresponding to a shape of the organic layer concave portion 131 and the organic layer convex portion 133, and the organic layer concave portion 131 and the organic layer convex portion 133 can be prepared to have the same step height of the concave portion 210 and the convex portion 230 of the ground line 200. Also, the ground line 200 can be prepared by a process having a high step coverage characteristic, whereby the ground line 200 can be formed while maintaining the shape of the organic layer concave portion 131 and the organic layer convex portion 133.

The organic layer 130 can be defined by a first surface 130a which is an upper surface overlapped with the convex portion 230 of the ground line 200, a second surface 130b which is an upper surface overlapped with the concave portion 210 of the ground line 200, a third surface 130c which is a lower surface overlapped with the convex portion 230 of the ground line 200, and a fourth surface 130d which is a lower surface overlapped with the concave portion 210 of the ground line 200.

A distance between the first surface 130a and the third surface 130c can be defined by a first thickness t1 of the organic layer, and the first thickness t1 can be a thickness obtained by adding a thickness of the organic layer 130 of the display area DA to a thickness of the etched depth d1 of the trench portion 129. Therefore, the first thickness t1 of the organic layer 130 of the non-display area NDA can be a thickness obtained by adding the thickness of T1 to the etched depth d1 of the trench portion 129. A distance between the second surface 130b and the fourth surface 130d can be defined by a second thickness t2 of the organic layer, and the second thickness t2 can be a thickness of a half or less of the first thickness t1. However, in the present disclosure, the second thickness t2 of the organic layer 130 is not limited to a half or less of the first thickness t1. Also, the second thickness t2 can be the same as the thickness of T2 of the organic layer 130 in FIG. 3.

The thicknesses t3 and t4 of the inorganic layer 120 can be defined as follows. In this case, when the thickness of the inorganic layer 120 is defined, the lower part of the inorganic layer 120 can be set as the upper surface of the link line 300 where the area overlapped with the concave portion 210, or and the lower part of the inorganic layer 120 can be set as the upper surface of the buffer layer 121 where the area overlapped with the convex portion 230 considering that the buffer layer 121 can be omitted in accordance with the configuration of the display apparatus.

The fourth thickness t4 of the inorganic layer 120 can be defined by the thickness of the inorganic layer 120 overlapped with the concave portion 210 of the ground line 200 on the upper surface of the link line 300. The third thickness t3 of the inorganic layer 120 can be defined by the thickness of the inorganic layer 120 overlapped with the convex portion 230 of the ground line 200 from the upper surface of the buffer layer 12. In this way, the third thickness t3 and the fourth thickness t4 are considered by excluding the thickness of the buffer layer 121.

In the structure of the ground line 200 having the concave portion 210 and the convex portion 230 in the present disclosure, in in order that the ground line 200 has a capacitance of the same level for the concave portion 210 and the convex portion 230, a capacitance value based on the organic layer 130 of the first thickness t1 and the inorganic layer 120 of the third thickness t3 should be equivalent to a capacitance value based on the organic layer 130 of the second thickness t2 and the inorganic layer 120 of the fourth thickness t4. If the second thickness t2 corresponding to the organic layer concave portion 131 is reduced to a predetermined thickness as compared with the first thickness t1 corresponding to the organic layer convex portion 133, the thickness of the inorganic layer 120 arranged below the organic layer 130 can be increased to compensate for the reduced thickness, whereby the ground line 200 can be set to have a parasitic capacitance of a level equivalent to that of the inorganic layer 120.

For example, if the first thickness t1 of the organic layer 130 is about 2 um, the second thickness t2 of the organic layer 130 can be about 1 um. At this time, the fourth thickness t4 of the inorganic layer 120 can have a thickness that compensates for a difference between the second thickness t2 of the organic layer 130 and the first thickness t1 of the organic layer 130. For example, if the organic layer 130 is prepared as a photo acrylate based resin, a dielectric constant of the organic layer 130 is about 3.7 F/m, and if the inorganic layer 120 is prepared as silicon oxide SiOx, a dielectric constant of silicon oxide SiOx is about 4.3 F/m. In this case, it is noted that the dielectric constant of the inorganic layer 120 is higher than the dielectric constant of the organic layer 130 as much as about 1.16 times.

The capacitance can be calculated as expressed by the following equation (1).

$$C = \varepsilon_0 * \varepsilon_r * A / d \quad (1)$$

In this case, $\varepsilon_0$ is a dielectric constant of vacuum, $\varepsilon_r$ is a dielectric constant of a dielectric material, A is an area of the dielectric material, and d is a distance between both ends of the dielectric material.

As expressed in the equation (1), the capacitance of a dielectric material is proportional to the dielectric constant, and is inversely proportional to a distance. Therefore, if a predetermined thickness of the organic layer 130 is reduced, a value of capacitance in the equation (1) can be increased. Therefore, if the thickness of the organic layer 130 arranged below the ground line 200 is reduced, the organic layer 130 can be affected by a metal line that includes the link line 300 arranged below the ground line 200. For example, if the thickness of the organic layer 130 corresponding to the concave portion 210 of the ground line 200 is set to a thickness obtained by the second thickness t2 reduced as much as 1 um as compared with the first thickness, it is preferable that the inorganic layer 120 compensates for and sets a thickness of an inorganic film to additionally make sure of a thickness corresponding to about 1.16 times of the reduced thickness of the organic layer 130.

The step height h1 of the concave portion 210 and the convex portion 230 of the ground line 200 can be described as follows. For example, if the first thickness t1 of the organic layer 130 is about 2 um, the second thickness t2 of the organic layer 130 can be about 1 um. At this time, if the depth d1 of the trench portion 129 of the aforementioned inorganic layer 120 is formed at a depth of about 600 nm, the step height of the organic layer convex portion 133 and the organic layer concave portion 131 can occur as much as about 400 nm. Also, the ground line 200 arranged on the organic layer 130 can be arranged to maintain the step height generated by the organic layer convex portion 133 and the organic layer concave portion 131 as it is, whereby the concave portion 210 and the convex portion 230 of the ground line 200 can be formed to have a step height equivalent to 400 nm. Therefore, the ground line 200 having such a step height can provide an increased surface area as compared with the ground line 200 having little step height.

Also, according to one example, if the thickness of the organic layer 130 arranged below the ground line 200 is set in the range of 1.2 um to 2 um, a capacitance formed by the organic layer 130 can be a negligible level that does not affect the operation of the ground line 200.

The ground line 200 can include the concave portion 210 and the convex portion 230 as described in FIGS. 1 and 2, and the concave portion 210 and the convex portion 230 of the ground line 200 can be formed along the organic layer concave portion 131 and the organic layer convex portion 133 formed in the organic layer 130.

In this case, the concave portion 210 of the ground line 200 can be defined as follows based on the step height h1 of the concave portion 210 and the convex portion 230. The concave portion 210 of the ground line 200 can be defined as an area formed at a half height or less of the step height h1, and the convex portion 230 of the ground line 200 can be defined as an area formed at a half height or more of the step height h1.

According to one example, the link line 300 can be arranged in at least a portion of the non-display area NDA, and can be arranged to be parallel with each of the concave portion 210 and the convex portion 230 of the ground line 200 in one direction. Also, the link line 300 can be arranged to overlap the concave portion 210.

Also, the second electrode 145 arranged to overlap the ground line 200 of the non-display area NDA can be formed while maintaining the shape of the ground line 200 that includes the aforementioned concave portion 210 and convex portion 230. Therefore, as the second electrode 145 has a step height structure formed by the concave portion 210 and the convex portion 230 of the ground line 200, its surface area can be increased to lower a resistance value of the second electrode 145 of the light emitting diode 140, luminance uniformity within the pixel can be enhanced, and driving reliability of the display apparatus can be improved. Also, the second electrode 145 can be formed by the concave portion 210 and the convex portion 230 of the ground line 200 to have a predetermined step height. If a residual stress of the display apparatus or a stress, which can occur outside the display apparatus, is applied to the second electrode 145 by the step height, a structure that the stress is dispersed can be provided, whereby reliability of the display apparatus can be improved.

Figure 6:
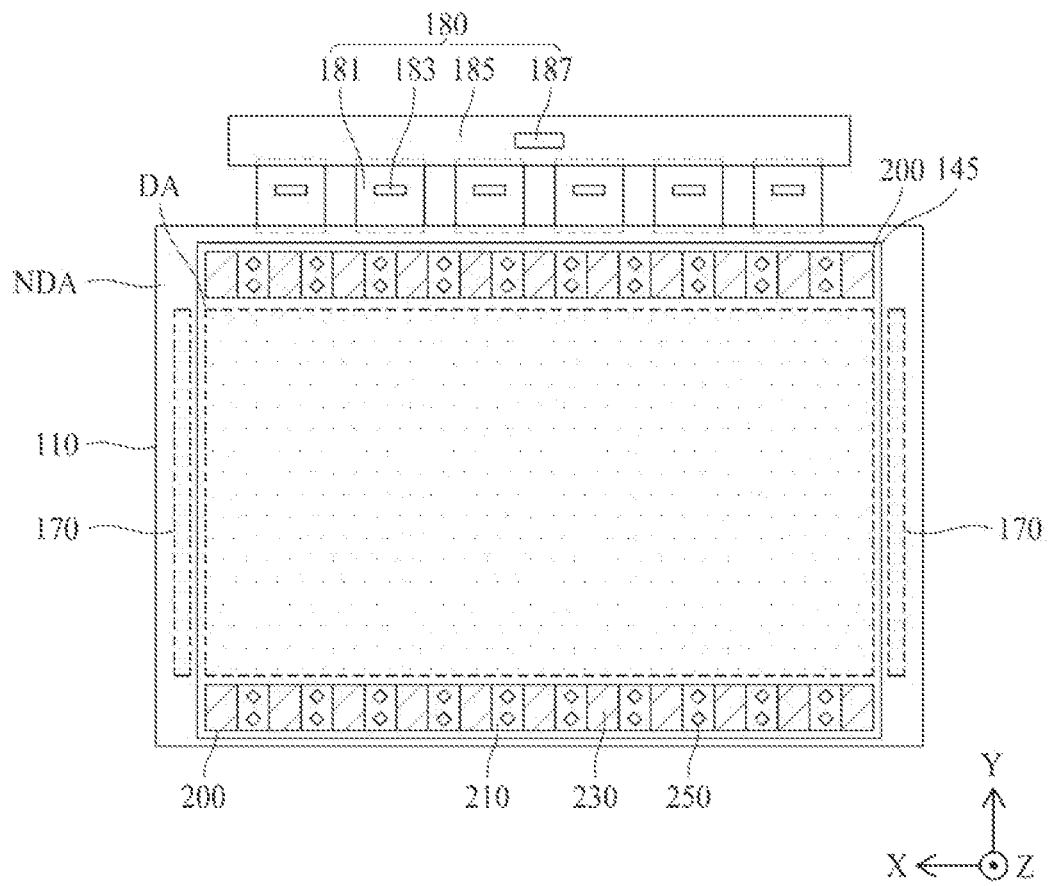
FIG. 6 is a plane view illustrating a display apparatus according to another embodiment of the present disclosure.
Figure 7:
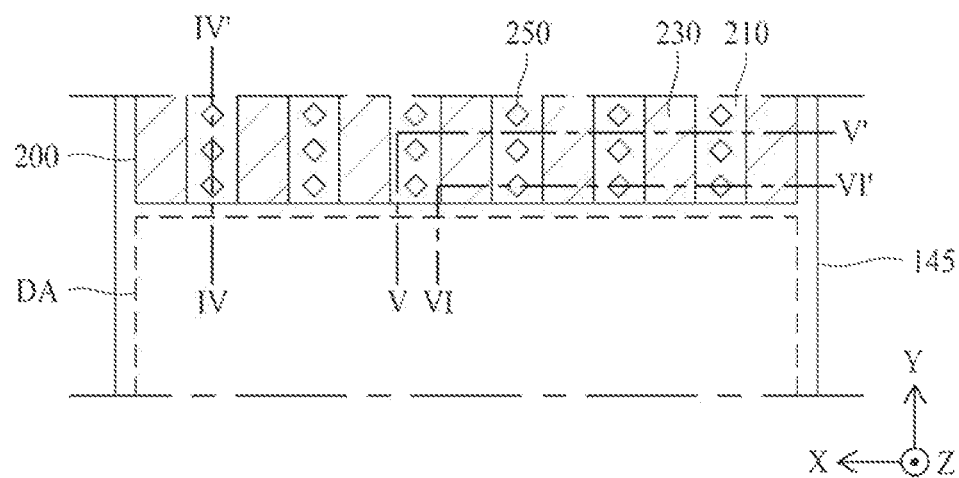
FIG. 7 briefly illustrates a display area and a ground line according to the present disclosure.
Figure 8:
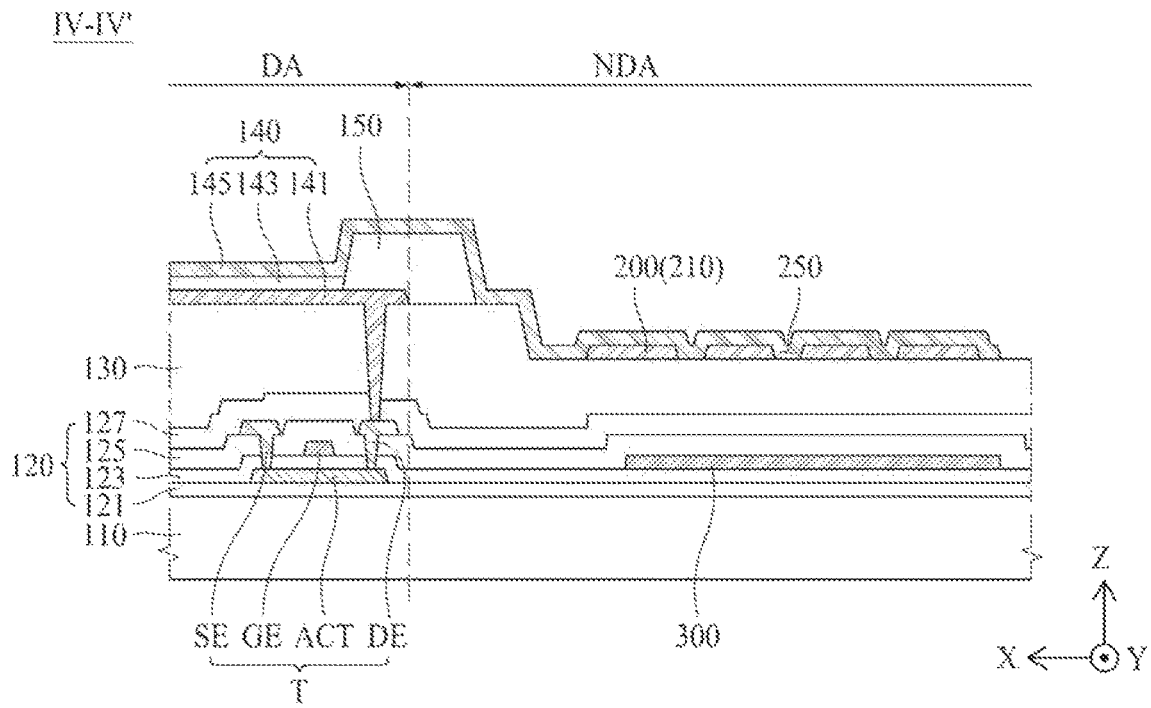
FIG. 8 is a cross-sectional view taken along line IV-IV' shown in FIG. 7.

FIG. 6 is a plane view illustrating a display apparatus according to one embodiment of the present disclosure, FIG. 7 briefly illustrates a display area and a ground line according to the present disclosure, and FIG. 8 is a cross-sectional view taken along line IV-IV' shown in FIG. 7. Since the display apparatus of FIGS. 6 to 8 is the same as the display apparatus of FIGS. 1 and 2 except that the display apparatus further comprises an opening portion 250 arranged to overlap the concave portion 210 of the ground line 200 and structural characteristics related to the concave portion 210 and the convex portion 230 of the ground line 200, its repeated description will be omitted. A sectional structure crossing the concave portion 230 of the ground line 200 in FIGS. 6 and 7 in Y direction can be the same as a sectional structure of FIG. 2.

Referring to FIGS. 6 to 8, the display apparatus according to one embodiment of the present disclosure can further comprise an opening portion 250 formed to overlap the concave portion 210. In this case, the opening portion 250 of the ground line 200 can be referred to as a hole pattern, a trench pattern, etc.

The opening portion 250 can be formed in the concave portion 210 of the ground line 200, and can be arranged to be spaced apart from another opening portion at a constant interval. Also, the opening portion 250 can be elongated in one direction, for example, X or Y direction.

Although the shape of the opening portion 250 is shown as a rhombus shape in FIGS. 6 and 7, the opening portion 250 is not limited to the rhombus shape, and can be formed in various shapes such as a circle, an oval, a square shape, a rectangular shape and a polygonal shape. The size of the opening portion 250 can be set within an unlimited range if it can be accommodated in the concave portion 210.

In the display apparatus of FIGS. 6 to 8, even though the ground line 200 further includes the opening portion 250 corresponding to the concave portion 210, the ground line 200 can be cut in only the opening portion 250, and the concave portion 210 and the convex portion can be connected with each other as one element.

According to one example, if a stress generated during a process of forming the display apparatus or the ground line 200 or a stress caused by an external factor is applied to the ground line 200 or an area adjacent to the ground line 200, the opening portion 250 of the ground line 200 can serve to disperse the stress.

The second electrode 145 formed at the upper portion of the ground line 200 can be provided to fill the opening portion 250.

According to one example, an area of the ground line 200 can be reduced by the introduction of the opening portion 250, whereby the resistance of the ground line 200 can be increased. Therefore, if the display apparatus according to one embodiment of the present disclosure further comprises the opening portion 250, the display apparatus can further comprise an auxiliary ground line 290 for compensating for the resistance reduction. The display apparatus that comprises the auxiliary ground line 290 will be described later with reference to FIGS. 12 to 16.

Figure 9:
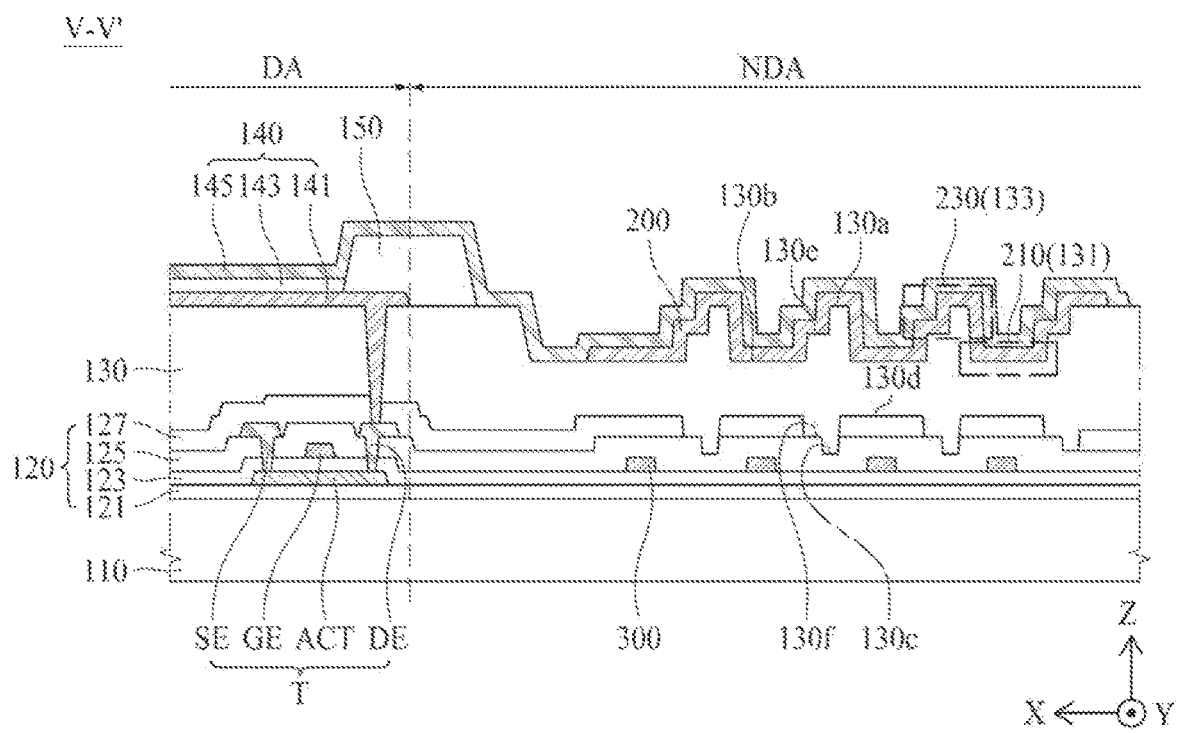
FIG. 9 is a cross-sectional view taken along line V-V' shown in FIG. 7.
Figure 10:
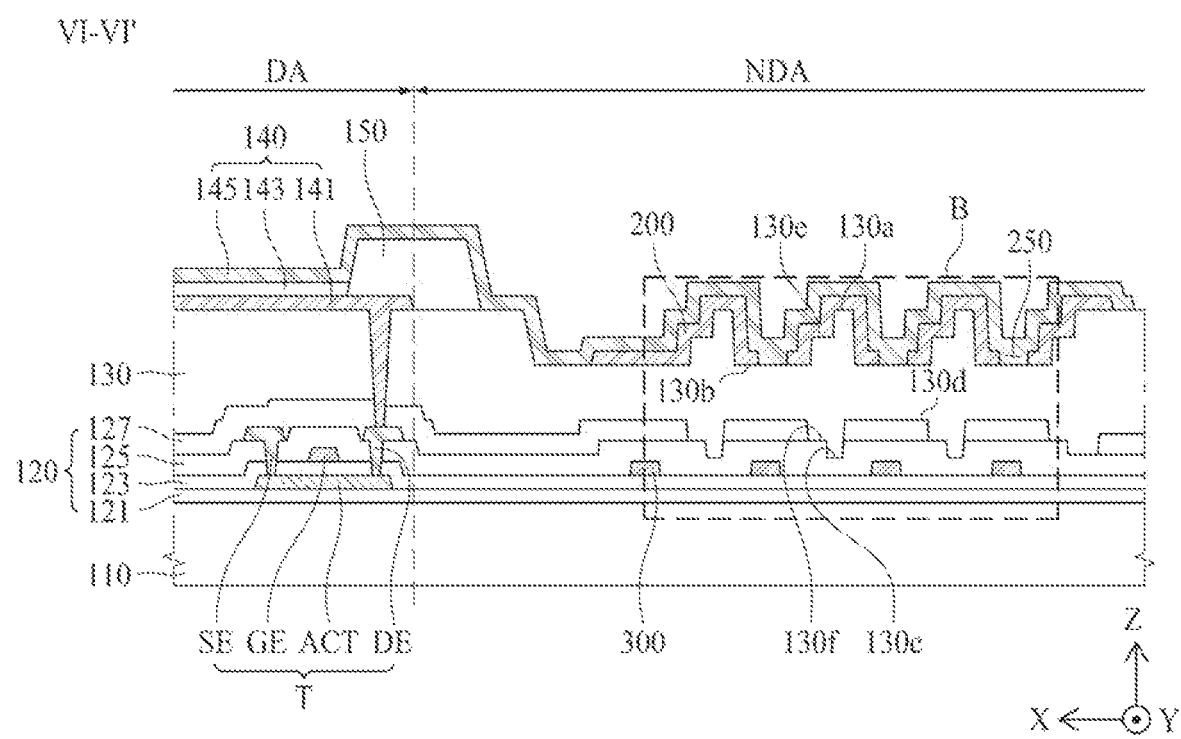
FIG. 10 is a cross-sectional view taken along line VI-VI' shown in FIG. 7.
Figure 11:
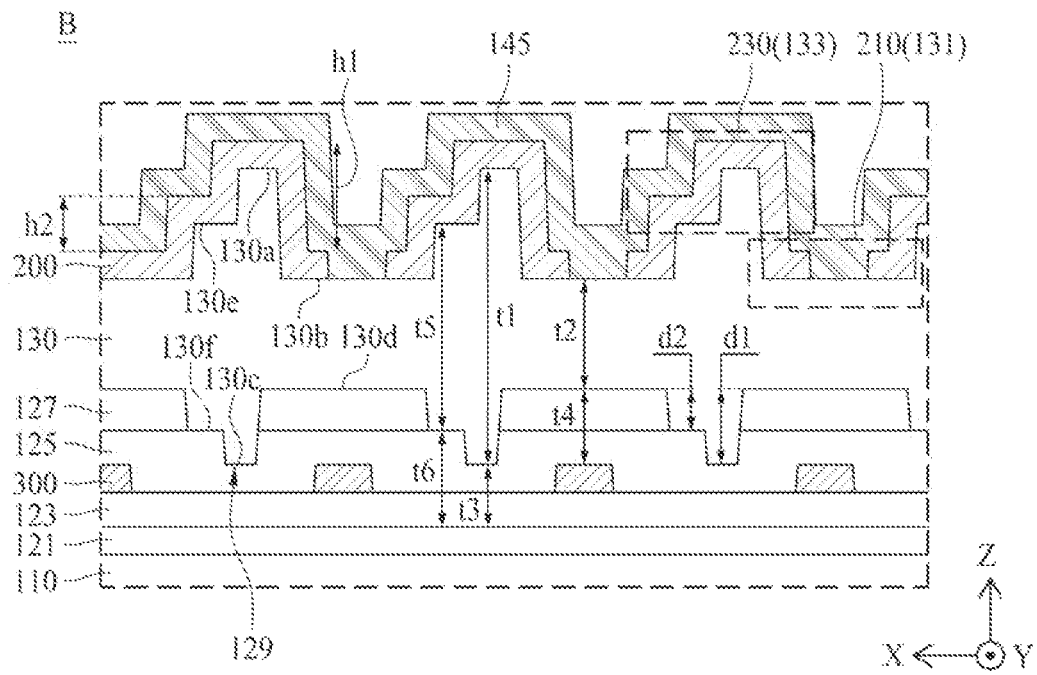
FIG. 11 is an enlarged view illustrating a portion B of FIG. 10.

FIG. 9 is a cross-sectional view taken along line V-V' shown in FIG. 7, FIG. 10 is a cross-sectional view taken along line VI-VI' shown in FIG. 7, and FIG. 11 is an enlarged view illustrating a portion B of FIG. 10.

Referring to FIGS. 9 to 11, as the ground line 200 has multiple step heights h1 and h2 formed by the concave portion 210 and the convex portion 230, its surface area can be increased. A structure of the ground line 200 of which surface area is increased as compared with the structure of the ground line 200 having no step height structure of the concave portion 210 and the convex portion 230 can be provided. Therefore, the display apparatus that comprises the ground line 200 according to the present disclosure can lower a resistance value of the second electrode 145 of the light emitting diode 140 and improve driving reliability of the display apparatus.

According to one example, the convex portion 230 of the ground line 200 can have a structure of a plurality of stairs. As the convex portion 230 of the ground line 200 has a plurality of stairs, if a stress generated during a process of forming the display apparatus or the ground line 200 or a stress caused by an external factor is applied to the ground line 200 or an area adjacent to the ground line 200, the convex portion 230 can serve to more disperse the stress.

In this case, the concave portion 210 and the convex portion 230 of the ground line 200 can be defined as follows based on the step height h1 of the concave portion 210 and the convex portion 230. The concave portion 210 can be defined as an area formed at a half height or less of the step height h1, and the convex portion 230 can be defined as an area formed at a half height or more of the step height h1.

According to one example, if the convex portion 230 of the ground line 200 is formed to include a structure of two stairs, the convex portion 230 of the ground line 200 can include a stair structure having a step height of a first height h1 and a second height h2 from the upper surface of the concave portion 210 overlapped with the second surface 130b of the organic layer. Also, although FIGS. 9 to 11 show that the convex portion 230 has a structure of two stairs, the embodiment of the present disclosure is not limited to this example, and the convex portion 230 can include a multi-stair structure of two or more stairs.

The inorganic layer 120 can include at least one trench portion 129, and the trench portion 129 can be arranged to overlap the convex portion 230 of the ground line 200 and non-overlap the concave portion 210 of the ground line 200. In the display apparatus according to the present disclosure, a stress propagated through the inorganic layer 120 can be reduced through at least one trench portion 129 formed in the inorganic layer 120, and reliability of the display apparatus can be improved. Also, the trench portion 129 can be arranged to be parallel with the link line 300, and the trench portion 129 can be formed in the area non-overlapped with the link line 300.

The trench portion 129 of the inorganic layer 120 can include multiple depths d1 and d2 corresponding to the multiple step heights h1 and h2 formed in the convex portion 230 of the ground line 200. At this time, a second depth d2 of the trench portion 120 and a sixth thickness t6 of the inorganic layer can be controlled to compensate for a fifth thickness t5 of the organic layer, which is reduced as compared with the first thickness t1. Also, although FIGS. 9 to 11 show that the trench portion 129 has a structure of two stairs, the embodiment of the present disclosure is not limited to this example, and the trench portion 129 can include a multi-stair structure having two or more stairs.

Also, although FIGS. 9 to 11 show that the trench portion 129 is formed through removal of the inter-layer dielectric layer 125 and the passivation layer 127, the embodiment of the present disclosure is not limited to this example. Therefore, the depth of the trench portion 129 in the embodiment of the present disclosure can be prepared as the buffer layer 121, the gate insulating layer 123, the inter-layer insulating layer 125 and the passivation layer 129 are selectively removed in accordance with a proper depth required in the display apparatus.

The organic layer 130 can be arranged to fill the trench portion 129 of the aforementioned inorganic layer 120. Also, the organic layer 130 according to the present disclosure can be prepared such that an upper surface of the organic layer 130 includes an organic layer concave portion 131 and an organic layer convex portion 133, thereby forming the structure corresponding to the concave portion 210 and the convex portion 230. According to one example, the organic layer concave portion 131 and the organic layer convex portion 133 can be prepared as the portion corresponding to the concave portion 131 of the organic layer 130 of the non-display area NDA is removed.

At this time, the organic layer convex portion 133 can be prepared to have a multi-stair structure corresponding to the convex portion 230 of the aforementioned ground line 200.

According to one example, the ground line 200 can have a shape corresponding to a shape of the organic layer concave portion 131 and the organic layer convex portion 133, and the organic layer concave portion 131 and the organic layer convex portion 133 can be prepared to have the same step height of the concave portion 210 and the convex portion 230 of the ground line 200. Also, the ground line 200 can be prepared by a process having a high step coverage characteristic, whereby the ground line 200 can be formed while maintaining the shape of the organic layer concave portion 131 and the organic layer convex portion 133.

The organic layer 130 can be defined by a first surface 130a which is an upper surface overlapped with the convex portion 230 of the ground line 200, a second surface 130b which is an upper surface overlapped with the concave portion 210 of the ground line 200, a third surface 130c which is a lower surface overlapped with the convex portion 230 of the ground line 200, and a fourth surface 130d which is a lower surface overlapped with the concave portion 210 of the ground line 200. Also, the organic layer 130 can further be defined by a fifth surface 130e overlapped with a stair additionally formed in the convex portion 230 and a sixth surface 130f overlapped with a stair additionally formed in the trench portion 129.

A distance between the first surface 130a and the third surface 130c can be defined by a first thickness t1 of the organic layer, and the first thickness t1 can be a thickness obtained by adding a thickness of the organic layer 130 of the display area DA to a thickness of the etched depth d1 of the trench portion 129. Therefore, the first thickness t1 of the organic layer 130 of the non-display area NDA can be a thickness obtained by adding the thickness of T1 to the etched depth d1 of the trench portion 129. A distance between the second surface 130b and the fourth surface 130d can be defined by a second thickness t2 of the organic layer, and the second thickness t2 can be a thickness of a half or less of the first thickness t1. However, in the present disclosure, the second thickness t2 of the organic layer 130 is not limited to a half or less of the first thickness t1. Also, the second thickness t2 can be the same as the thickness of T2 of the organic layer 130 in FIG. 3. A distance between the fifth surface 130e and the sixth surface 130f can be defined by the fifth thickness t5. The fifth thickness t5 can be thicker than the second thickness t2 and thinner than the first thickness t1.

The thicknesses t3, t4 and t6 of the inorganic layer 120 can be defined as follows. In this case, when the thickness of the inorganic layer 120 is defined, the lower part of the inorganic layer 120 can be set as the upper surface of the link line 300 where the area overlapped with the concave portion 210, or and the lower part of the inorganic layer 120 can be set as the upper surface of the buffer layer 121 where the area overlapped with the convex portion 230 considering that the buffer layer 121 can be omitted in accordance with the configuration of the display apparatus.

The fourth thickness t4 of the inorganic layer 120 can be defined by the thickness of the inorganic layer 120 overlapped with the concave portion 210 of the ground line 200 on the upper surface of the link line 300. The third thickness t3 of the inorganic layer 120 can be defined by the thickness of the inorganic layer 120 overlapped with the trench portion 129 formed at the first depth d1 and the convex portion 230 of the ground line 200 from the upper surface of the buffer layer 12. The sixth thickness t6 of the inorganic layer 120 can be defined by the thickness of the inorganic layer 120 overlapped with the trench portion 129 formed at the second depth d2 and the convex portion 230 of the ground line 200 from the upper surface of the buffer layer 12. In this way, the third thickness t3 and the sixth thickness t6 are considered by excluding the thickness of the buffer layer 121.

If the thickness of the organic layer 130 is reduced to the second thickness t2 or the fifth thickness t5 based on the first thickness t1, the thickness of the inorganic layer 120 can be increased to the fourth thickness t4 or the sixth thickness t6 correspondingly to compensate for the reduced thickness. Therefore, in the present disclosure, the capacitance of the ground line 200 can substantially be maintained at an equivalent level.

The step heights h1 and h2 of the concave portion 210 and the convex portion 230 of the ground line 200 can be described as follows. For example, if the first thickness t1 of the organic layer 130 is about 2 um, the second thickness t2 of the organic layer 130 can be about 1 um. Also, if the depth d1 of the trench portion 129 of the aforementioned inorganic layer 120 is formed at a depth as much as 600 nm, a step height of the organic layer convex portion 133 and the organic layer concave portion 131 can occur as much as 400 nm. Also, the ground line 200 arranged on the organic layer 130 can be arranged to maintain the step height generated by the organic layer convex portion 133 and the organic layer concave portion 131 as it is, whereby the concave portion 210 and the convex portion 230 of the ground line 200 can be formed to have a step height equivalent to 400 nm. Therefore, the ground line 200 having such a step height can provide an increased surface area as compared with the ground line 200 having little step height.

At this time, the second depth d2 of the trench portion 129 can be set without restriction in the range of the first depth d1 or less, and the second step height h2 of the convex portion 230 can be set without restriction in the range of the first step height h1 or less.

Figure 12:
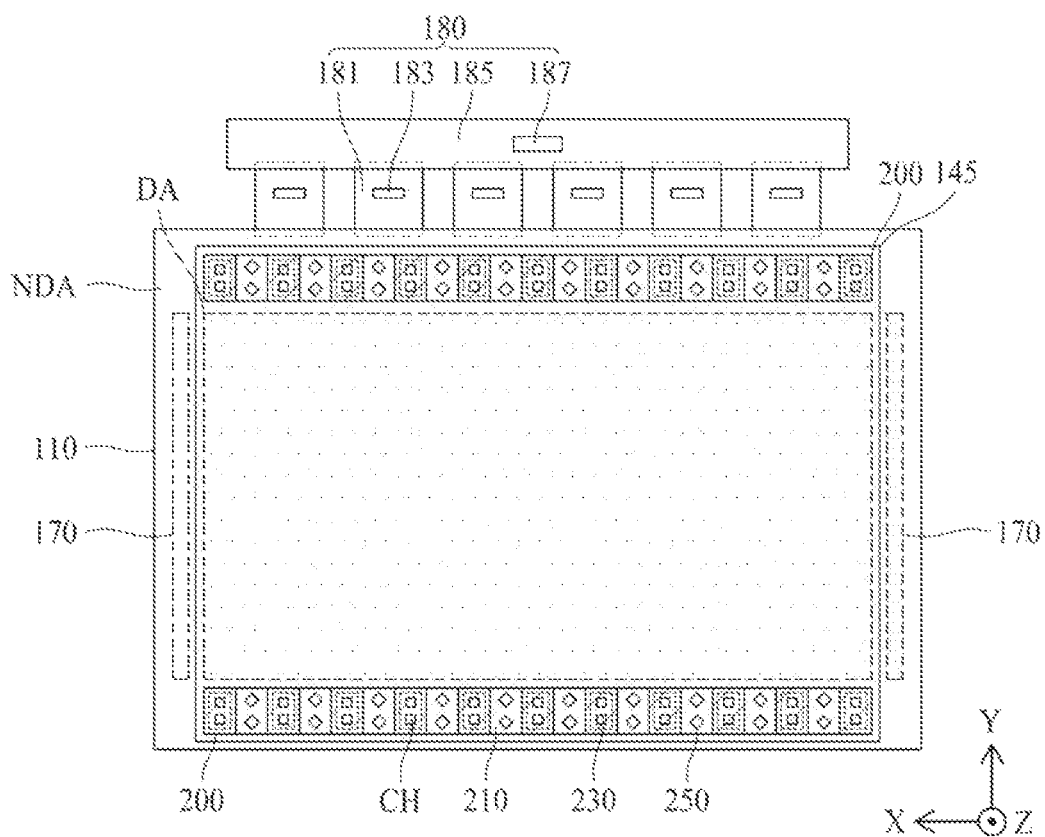
FIG. 12 is a plane view illustrating a display apparatus according to another embodiment of the present disclosure.
Figure 13:
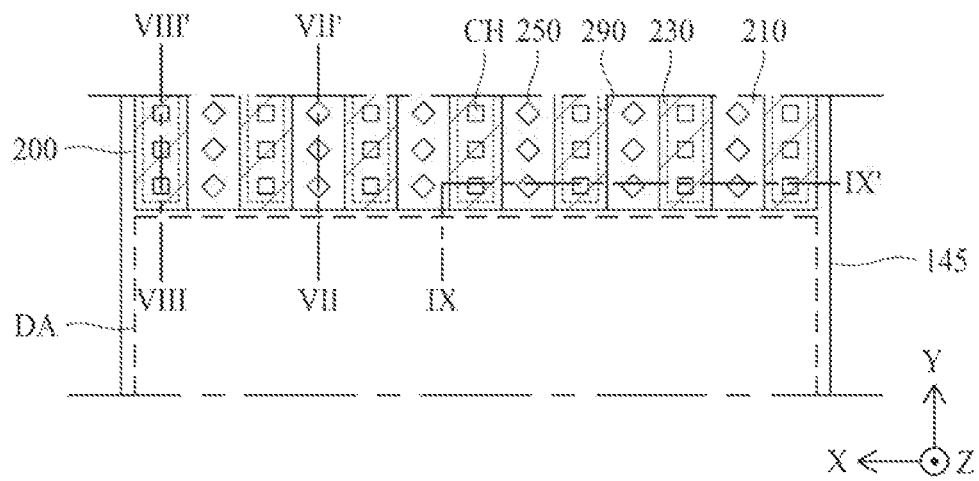
FIG. 13 briefly illustrates a display area and a ground line according to the present disclosure.
Figure 14:
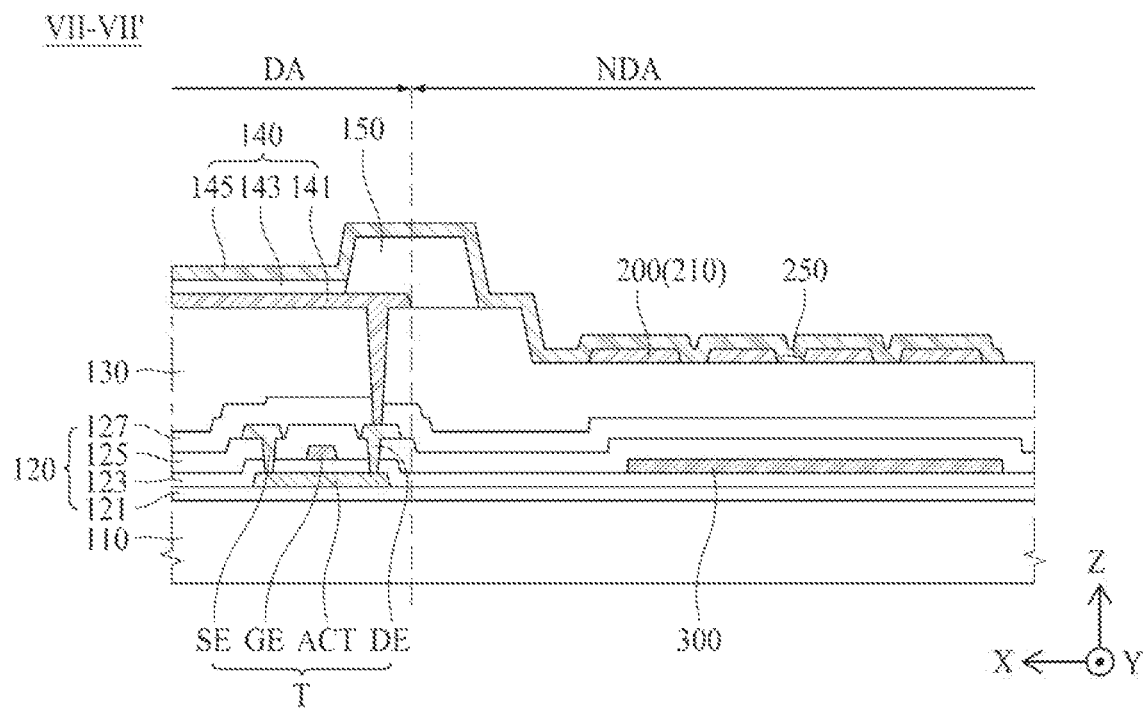
FIG. 14 is a cross-sectional view taken along line VII-VII' shown in FIG. 13.
Figure 15:
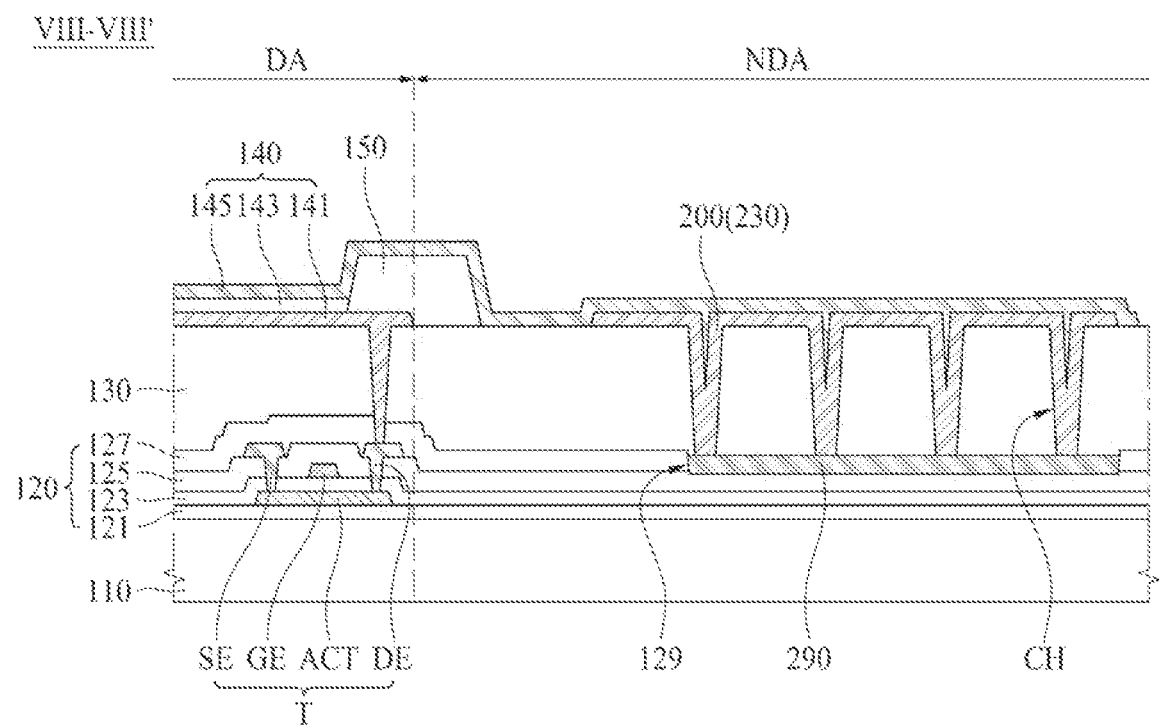
FIG. 15 is a cross-sectional view taken along line VIII-VIII' shown in FIG. 13.
Figure 16:
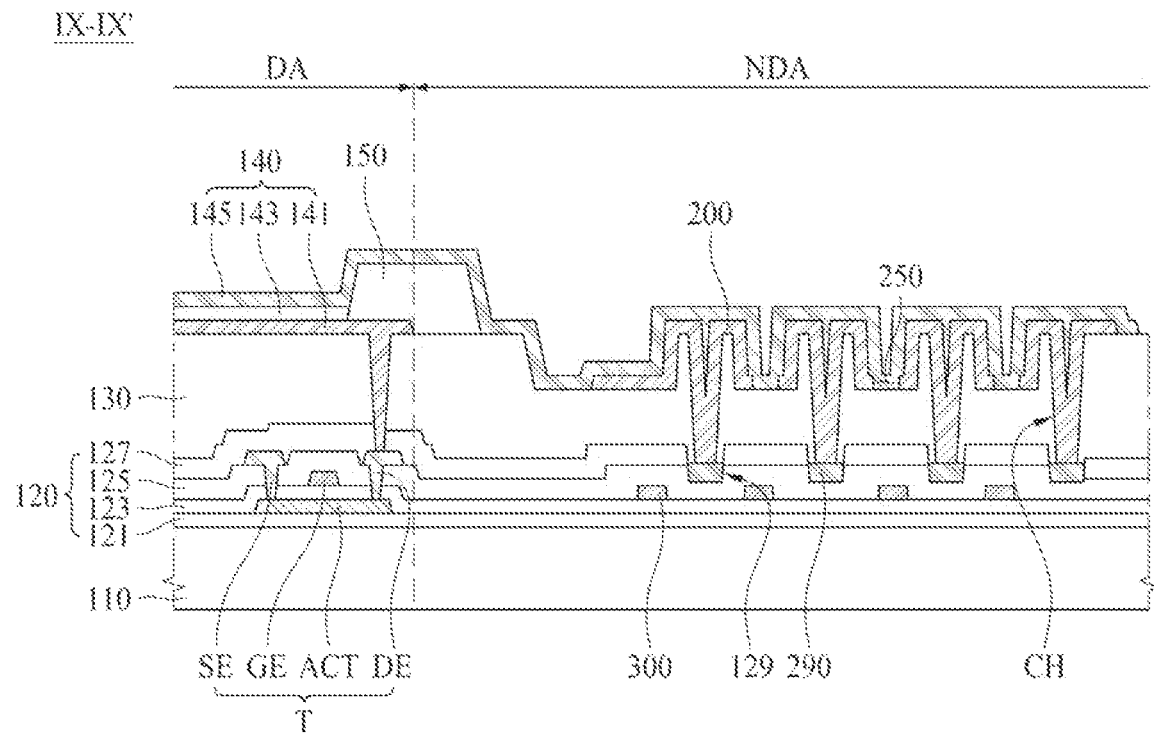
FIG. 16 is a cross-sectional view taken along line IX-IX' shown in FIG. 13.

FIG. 12 is a plane view illustrating a display apparatus according to one embodiment of the present disclosure, FIG. 13 briefly illustrates a display area and a ground line according to the present disclosure, FIG. 14 is a cross-sectional view taken along line VII-VII' shown in FIG. 13, FIG. 15 is a cross-sectional view taken along line VIII-VIII' shown in FIG. 13, and FIG. 16 is a cross-sectional view taken along line IX-IX' shown in FIG. 13.

Referring to FIGS. 12 to 16, the display apparatus according to the present disclosure can further comprise an auxiliary ground line 290, and a contact hole CH for electrically connecting the ground line 200 with the auxiliary ground line 290.

If the opening portion 250 is introduced in the concave portion 21, the area of the ground line 200 can be reduced, whereby the resistance of the ground line 200 can be increased. The display apparatus of FIGS. 12 to 16 can further comprise the auxiliary ground line 290 for compensating for the resistance increase of the ground line 200.

According to one example, the auxiliary ground line 290 can be arranged to be accommodated in the trench portion 129 formed in the inorganic layer 120. Also, the display apparatus can further comprise a contact hole CH for connecting the convex portion 230 of the ground line 200 to the auxiliary ground line 290.

The auxiliary ground line 290 can be arranged to be accommodated in the trench 129 of the inorganic layer 120. In this case, the auxiliary ground line 290 can be referred to as an auxiliary metal layer, an auxiliary electrode, etc.

The contact hole CH can be arranged in at least a portion of the convex portion 230, and can provide a path for electrically connecting the concave portion 230 of the ground line 200 with the auxiliary ground line 290. The contact hole CH can be formed in at least portion of the convex portion 230, and can be formed by removing the organic layer 130 and removing at least a portion of the inorganic layer 120.

As shown in FIG. 14, the display apparatus according to one embodiment of the present disclosure can further comprise an opening portion 250 formed to overlap the concave portion 210. In this case, the opening portion 250 of the ground line 200 can be referred to as a hole pattern, a trench pattern, etc. The opening portion 250 can be formed in the concave portion 210 of the ground line 200, and can be arranged to be spaced apart from another opening portion at a constant interval. Although the shape of the opening portion 250 is shown as a rhombus shape in FIGS. 12 and 13, the opening portion 250 is not limited to the rhombus shape, and can be formed in various shapes such as a circle, an oval, a rectangular shape and a polygonal shape. The size of the opening portion 250 can be set within an unlimited range if it can be accommodated in the concave portion 210.

According to one example, if a stress generated during a process of forming the display apparatus or the ground line 200 or a stress caused by an external factor is applied to the ground line 200 or an area adjacent to the ground line 200, the opening portion 250 of the ground line 200 can serve to more disperse the stress. However, the opening portion 250 can increase the resistance of the ground line 200 by reducing the area of the ground line 200.

As shown in FIGS. 15 and 16, the ground line 200 can compensate for the resistance increased by the introduction of the opening portion 250 by providing the structure that the convex portion 230 is electrically connected with the auxiliary ground line 290 formed to be accommodated in the trench portion 129 through the contact hole CH. Also, as the ground line 200 is formed by an increased area in the contact hole CH by formation of the contact hole CH, the resistance increased by the introduction of the opening portion 250 can additionally be compensated.

According to one example, the auxiliary ground line 290 is preferably arranged to non-overlap the link line 300 arranged on the substrate 110, whereby interference between the auxiliary ground line 290 and the link line 300 can be minimized.

The display apparatus according to one or more embodiments of the present disclosure can be described as follows.

The display apparatus according to one embodiment of the present disclosure comprises a substrate including a display area and a non-display area, an inorganic layer formed on the substrate, an organic layer formed on the inorganic layer, a light emitting diode formed in the display area of the substrate, including a first electrode, a light emitting layer and a second electrode, and a ground line formed on the organic layer and formed in at least a portion of the non-display area, wherein the ground line and the second electrode are electrically connected with each other, and the ground line includes at least one concave portion and at least one convex portion, which are arranged to adjoin each other.

According to some embodiments of the present disclosure, the inorganic layer can include at least one trench portion formed in the non-display area.

According to some embodiments of the present disclosure, the trench portion can be overlapped with the convex portion of the ground line.

According to some embodiments of the present disclosure, the organic layer can include an organic layer convex portion overlapped with the convex portion of the ground line, and an organic layer concave portion overlapped with the concave portion of the ground line.

According to some embodiments of the present disclosure, the organic layer can have a first thickness corresponding to the convex portion of the ground line and a second thickness corresponding to the concave portion of the ground line, and the first thickness can be thicker than the second thickness.

According to some embodiments of the present disclosure, the inorganic layer can have a third thickness corresponding to the convex portion of the ground line and a fourth thickness corresponding to the concave portion of the ground line, and the fourth thickness can be thicker than the third thickness.

According to some embodiments of the present disclosure, the fourth thickness of the inorganic layer can be set to compensate for a difference between the first thickness and the second thickness of the organic layer.

According to some embodiments of the present disclosure, the display apparatus can further comprise a link line formed on the substrate, wherein the link line can be arranged to non-overlap the convex portion of the ground line.

According to some embodiments of the present disclosure, the concave portion of the ground line and the convex portion of the ground line can be formed to have a step height of a first height h1 ranging from 300 nm to 900 nm.

According to some embodiments of the present disclosure, the display apparatus can further comprise an opening portion formed to partially overlap the concave portion of the ground line, wherein the opening portion can pass through one surface and the other surface of the ground line.

According to some embodiments of the present disclosure, the convex portion of the ground line can have a step height of multiple heights for the concave portion of the ground line.

According to some embodiments of the present disclosure, the trench portion can have a step height of multiple depths for an upper surface of the inorganic layer.

According to some embodiments of the present disclosure, the display apparatus can further comprise an auxiliary ground line accommodated in the trench portion.

According to some embodiments of the present disclosure, the passivation layer can include a contact hole for exposing at least a portion of the auxiliary ground line, and the ground line can be provided to fill at least a portion of the contact hole.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus comprising:
   a substrate including a display area and a non-display area;
   an inorganic layer provided on the substrate;
   an organic layer provided on the inorganic layer;
   a light emitting diode provided in the display area of the substrate, the light emitting diode including a first electrode, a light emitting layer and a second electrode; and
   a ground line provided on the organic layer and provided in at least a portion of the non-display area,
   wherein the ground line and the second electrode are electrically connected with each other,
   wherein the ground line includes a plurality of concave portions and a plurality of convex portions alternately arranged in the non-display area,
   wherein the inorganic layer includes a plurality of trench portions in the non-display area, and
   wherein a center of each of the plurality of convex portions is aligned with and overlaps a center of a corresponding trench portion among the plurality of trench portions.

2. The display apparatus of claim 1, wherein the organic layer includes:
   an organic layer convex portion overlapped with at least one convex portion of the ground line from among the plurality of convex portions; and
   an organic layer concave portion overlapped with at least one concave portion of the ground line from among the plurality of concave portions.

3. The display apparatus of claim 2, wherein the organic layer has a first thickness corresponding to the at least one convex portion of the ground line and a second thickness corresponding to the concave portion of the ground line, and the first thickness is thicker than the second thickness.

4. The display apparatus of claim 3, wherein the inorganic layer has a third thickness corresponding to the at least one convex portion of the ground line and a fourth thickness corresponding to the concave portion of the ground line, and the fourth thickness is thicker than the third thickness.

5. The display apparatus of claim 4, wherein the fourth thickness of the inorganic layer is set to compensate for a difference between the first thickness and the second thickness of the organic layer.

6. The display apparatus of claim 1, further comprising a link line provided on the substrate,
   wherein the link line is arranged to non-overlap at least one convex portion of the ground line from among the plurality of convex portions.

7. The display apparatus of claim 1, wherein at least one concave portion of the ground line from among the plurality of concave portions and the at least one convex portion of the ground line from among the plurality of convex portions are provided to have a step height of a first height ranging from approximately 300 nm to 900 nm.

8. The display apparatus of claim 1, further comprising an opening portion provided to partially overlap at least one concave portion of the ground line from among the plurality of concave portions,
   wherein the opening portion passes through opposite surfaces of the ground line.

9. The display apparatus of claim 1, wherein at least one convex portion of the ground line from among the plurality of convex portions has a step height of multiple heights for the at least one concave portion of the ground line.

10. The display apparatus of claim 1, wherein at least one trench portion from among the plurality of trench portions has a step height of multiple depths for an upper surface of the inorganic layer.

11. The display apparatus of claim 1, further comprising an auxiliary ground line accommodated in at least one trench portion among the plurality of trench portions.

12. The display apparatus of claim 11, wherein the inorganic layer includes a passivation layer which includes a contact hole for exposing at least a portion of the auxiliary ground line, and
   the ground line is provided to fill at least a portion of the contact hole.

13. The display apparatus of claim 1, wherein the second electrode includes a plurality of concave portions and a plurality of convex portions alternately arranged in the non-display area, and
   wherein the plurality of concave portions and the plurality of convex portions of the second electrode overlap with the plurality of concave portions and the plurality of convex portions of the ground line, respectively.

14. The display apparatus of claim 1, wherein each of the plurality of convex portions of the ground line includes a stepped portion aligned to correspond to a stepped portion in a corresponding trench portion among the plurality of trench portions.

15. The display apparatus of claim 1, wherein each of the plurality of convex portions of the ground line is wider than each of the plurality of trench portions.

16. A display apparatus comprising:
   a substrate including a display area and a non-display area;
   an inorganic layer provided on the substrate;
   an organic layer provided on the inorganic layer;
   a light emitting diode provided in the display area of the substrate, the light emitting diode including a first electrode, a light emitting layer and a second electrode; and
   a ground line provided on the organic layer and provided in at least a portion of the non-display area,
   wherein the ground line and the second electrode are electrically connected with each other,
   wherein the ground line includes a plurality of concave portions and a plurality of convex portions alternately arranged in the non-display area,
   wherein the inorganic layer includes a plurality of trench portions in the non-display area,
   wherein the second electrode includes a plurality of concave portions and a plurality of convex portions alternately arranged in the non-display area, and
   wherein the plurality of concave portions and the plurality of convex portions of the second electrode overlap with the plurality of concave portions and the plurality of convex portions of the ground line, respectively; and
   wherein each of the plurality of convex portions of the ground line includes a depression overlapping with a corresponding trench portion among the plurality of trench portions, and a portion of the ground line is disposed in the depression.

17. The display apparatus of claim 16, wherein each of the plurality of convex portions of the ground line includes a stepped portion corresponding to a stepped portion in a corresponding trench portion among the plurality of trench portions.

18. The display apparatus of claim 16, wherein portion of the ground line extends through a hole in the organic layer and contacts an auxiliary ground line disposed in the corresponding trench portion.

19. The display apparatus of claim 16, wherein each of the plurality of convex portions of the ground line is wider than each of the plurality of trench portions.

* * * * *